United States Patent
Reeswinkel

(10) Patent No.: US 10,749,084 B2
(45) Date of Patent: Aug. 18, 2020

(54) OPTOELECTRONIC COMPONENT AND METHOD OF PRODUCING AN OPTOELECTRONIC COMPONENT

(71) Applicant: OSRAM OLED GmbH, Regensburg (DE)

(72) Inventor: Thomas Reeswinkel, Regensburg (DE)

(73) Assignee: OSRAM OLED GmbH, Regensburg (DE)

(*) Notice: Subject to any disclaimer, the term of this patent is extended or adjusted under 35 U.S.C. 154(b) by 0 days.

(21) Appl. No.: 16/091,321

(22) PCT Filed: Apr. 7, 2017

(86) PCT No.: PCT/EP2017/058371
§ 371 (c)(1),
(2) Date: Oct. 4, 2018

(87) PCT Pub. No.: WO2017/174779
PCT Pub. Date: Oct. 12, 2017

(65) Prior Publication Data
US 2019/0157525 A1 May 23, 2019

(30) Foreign Application Priority Data
Apr. 8, 2016 (DE) .................. 10 2016 106 494

(51) Int. Cl.
*H01L 33/00* (2010.01)
*H01L 33/56* (2010.01)
(Continued)

(52) U.S. Cl.
CPC .............. *H01L 33/56* (2013.01); *H01L 24/73* (2013.01); *H01L 27/0248* (2013.01);
(Continued)

(58) Field of Classification Search
CPC ..... H01L 24/73; H01L 27/0248; H01L 33/56; H01L 33/60; H01L 33/52
(Continued)

(56) References Cited

U.S. PATENT DOCUMENTS

2013/0020590 A1* 1/2013 Lin .................. H01L 33/60
257/88
2013/0264602 A1 10/2013 Namiki et al.
(Continued)

FOREIGN PATENT DOCUMENTS

DE 10 2010 027 748 A1 10/2011
DE 10 2010 052 835 A1 5/2012
(Continued)

OTHER PUBLICATIONS

"EG-Sicherheitsdatenblatt OxiProtect JE790," Jentner Plating Technology GmbH, 2012, pp. 1-4.
(Continued)

*Primary Examiner* — Tan N Tran
(74) *Attorney, Agent, or Firm* — DLA Piper LLP (US)

(57) ABSTRACT

An optoelectronic component includes a carrier having a chip mounting face, wherein the chip mounting face has a reflection coating, and an optoelectronic semiconductor chip adhesively bonded on the reflection coating by an adhesive so that the reflection coating is subdivided into a first subsection covered by the semiconductor chip and a second subsection, which is free of the semiconductor chip, wherein the adhesive has reflection particles that reflect electromagnetic radiation emitted by the semiconductor chip, and the second subsection is at least partially covered by a corrosion protection layer.

20 Claims, 2 Drawing Sheets

(51) Int. Cl.
  *H01L 33/60* (2010.01)
  *H01L 33/62* (2010.01)
  *H01L 23/00* (2006.01)
  *H01L 27/02* (2006.01)
  *H01L 33/48* (2010.01)
  *H01L 25/16* (2006.01)

(52) U.S. Cl.
  CPC .............. *H01L 33/60* (2013.01); *H01L 33/62* (2013.01); *H01L 25/167* (2013.01); *H01L 33/486* (2013.01); *H01L 2224/48091* (2013.01); *H01L 2224/73265* (2013.01); *H01L 2224/8592* (2013.01); *H01L 2924/181* (2013.01); *H01L 2933/005* (2013.01); *H01L 2933/0058* (2013.01); *H01L 2933/0066* (2013.01); *H01L 2933/0091* (2013.01)

(58) Field of Classification Search
  USPC ......................................................... 257/98
  See application file for complete search history.

(56) References Cited

U.S. PATENT DOCUMENTS

| | | | |
|---|---|---|---|
| 2015/0108510 A1* | 4/2015 | Urano | H01L 33/60 257/88 |
| 2015/0372062 A1 | 12/2015 | Ingle | |
| 2016/0087161 A1 | 3/2016 | Wirth et al. | |
| 2016/0218261 A1 | 7/2016 | Moosburger et al. | |
| 2016/0284679 A1 | 9/2016 | Moosburger et al. | |

FOREIGN PATENT DOCUMENTS

| | | |
|---|---|---|
| DE | 10 2012 109 218 A1 | 4/2014 |
| DE | 10 2013 207 611 A1 | 10/2014 |
| DE | 10 2013 110 114 A1 | 4/2015 |
| DE | 10 2013 220 674 A1 | 4/2015 |
| DE | 10 2013 112 886 A1 | 5/2015 |
| DE | 10 2014 106 073 A1 | 11/2015 |
| DE | 10 2014 107 964 A1 | 12/2015 |
| EP | 2 387 083 A1 | 11/2011 |
| EP | 2 626 918 A2 | 8/2013 |
| EP | 2 765 173 A1 | 8/2014 |
| EP | 2 945 197 A1 | 11/2015 |
| EP | 3 051 598 A1 | 8/2016 |
| WO | 2015/044529 A1 | 4/2015 |

OTHER PUBLICATIONS

"Beschreibung OxiProtect JE790," Jentner Plating Technology GmbH, 2013.

"EG-Sicherheitsdatenblatt Silberanlaufschutz DICO-brite WS", DICO-Süd GmbH, 2014, pp. 1-4.

* cited by examiner

OPTOELECTRONIC COMPONENT AND METHOD OF PRODUCING AN OPTOELECTRONIC COMPONENT

TECHNICAL FIELD

This disclosure relates to an optoelectronic component and a method of producing an optoelectronic component.

BACKGROUND

Carriers for optoelectronic semiconductor chips conventionally have a chip mounting face on which an optoelectronic semiconductor chip is adhesively bonded. To reflect electromagnetic radiation emitted by the optoelectronic semiconductor chip efficiently away from the carrier, provision is, for example, made for the chip mounting face to have a reflection coating on which the semiconductor chip is adhesively bonded. The reflection coating is, for example, a silver coating.

However, the reflection coating may degrade because of corrosion and change its original color, for example, under the effect of corrosive gases, for example, $H_2S$ gas. For example, a silver layer changes its color from a specular metallic silver to a darker color under the effect of $H_2S$ gas. Because of this color change, reflectivity of the corroded reflection coating decreases. Since the reflectivity changes or degrades differently depending on the wavelength, the color of the reflected light may also change compared to the light incident on the corroded reflection coating. The color locus of the light emitted by the optoelectronic component may therefore change compared to the uncorroded component.

It could therefore be helpful to provide an efficient and, in particular, color-stable reflectivity of electromagnetic radiation emitted by an optoelectronic semiconductor chip.

SUMMARY

I provide an optoelectronic component including a carrier having a chip mounting face, wherein the chip mounting face has a reflection coating, and an optoelectronic semiconductor chip adhesively bonded on the reflection coating by an adhesive so that the reflection coating is subdivided into a first subsection covered by the semiconductor chip and a second subsection, which is free of the semiconductor chip, wherein the adhesive has reflection particles that reflect electromagnetic radiation emitted by the semiconductor chip, and the second subsection is at least partially covered by a corrosion protection layer.

I also provide an optoelectronic component including a carrier having a chip mounting face, wherein the chip mounting face has a reflection coating, and an optoelectronic semiconductor chip adhesively bonded on the reflection coating by an adhesive so that the reflection coating is subdivided into a first subsection covered by the semiconductor chip and a second subsection, which is free of the semiconductor chip, wherein the adhesive has reflection particles that reflect electromagnetic radiation emitted by the semiconductor chip, the second subsection is at least partially covered by a corrosion protection layer, the adhesive at least partially covers an edge region extending around the semiconductor chip, the edge region being part of the second subsection, the adhesive protrudes beyond the semiconductor chip, and the corrosion protection layer is arranged on the protruding adhesive.

I further provide a method of producing an optoelectronic component including providing a carrier having a chip mounting face, the chip mounting face having a reflection coating, and adhesively bonding an optoelectronic semiconductor chip onto the chip mounting face by an adhesive so that the reflection coating is subdivided into a first subsection covered by the semiconductor chip and a second subsection, which is free of the semiconductor chip, the adhesive having reflection particles that reflect electromagnetic radiation emitted by the semiconductor chip, and the second subsection is covered at least partially by a corrosion protection layer after the adhesive bonding.

Figure 1:
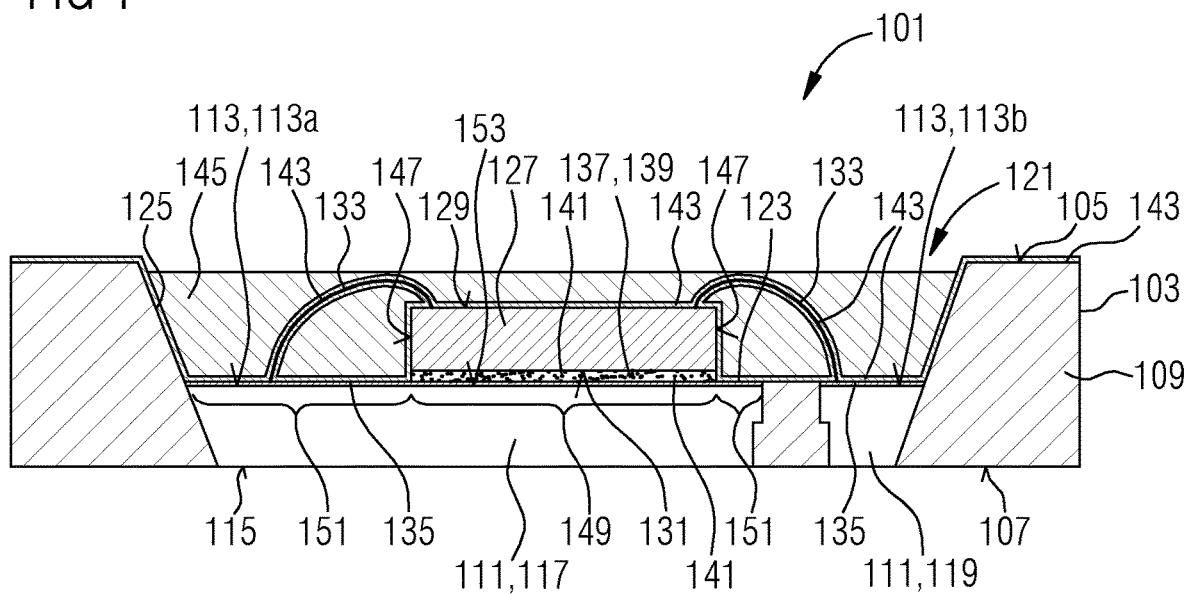
FIG. 1 shows a first optoelectronic component.

LIST OF REFERENCES 101 optoelectronic component
103 housing
105 upper side of the housing
107 lower side of the housing
109 housing frame
111 lead frame
113 upper side of the lead frame
115 lower side of the lead frame
117 1$^{st}$ contact section
119 2$^{nd}$ contact section
113a upper side of the 1$^{st}$ contact section 117
113b lower side of the 2$^{nd}$ contact section 119
121 cavity
123 bottom region of the cavity
125 wall of the cavity/lateral face
127 optoelectronic semiconductor chip
129 upper side of the semiconductor chip
131 lower side of the semiconductor chip
133 bonding wire
135 reflection coating
137 adhesive
139 adhesive layer
141 reflection particles
143 corrosion protection layer, inorganic coating
145 casting
147 sidewalls of the semiconductor chip
149 first subsection
151 second subsection
153 chip mounting face
201 provision
203 adhesive bonding
205 subdivision
207 covering
301 optoelectronic component
303 carrier
305 upper side of the carrier 303
307 lower side of the carrier 303
309, 311, 313, 315 metallizations
317 chip mounting face
319 reflection coating
321 optoelectronic semiconductor chip
323 upper side of the optoelectronic semiconductor chip 321
325 lower side of the optoelectronic semiconductor chip 321

327 upper side of the metallization 309
329 adhesive
331 upper side of the metallization 311
333 casting

DETAILED DESCRIPTION

My optoelectronic component may comprise:
a carrier having a chip mounting face,
wherein the chip mounting face has a reflection coating,
an optoelectronic semiconductor chip adhesively bonded on the reflection coating by an adhesive so that the reflection coating is subdivided into a first subsection covered by the semiconductor chip and a second subsection, which is free of the semiconductor chip,
wherein the adhesive has reflection particles to reflect electromagnetic radiation emitted by the semiconductor chip, and
the second subsection is at least partially covered by a corrosion protection layer.

I also provide a method of producing an optoelectronic component, comprising the following steps:
providing a carrier having a chip mounting face, the chip mounting face having a reflection coating,
adhesively bonding an optoelectronic semiconductor chip onto the chip mounting face by an adhesive so that the reflection coating is subdivided into a first subsection covered by the semiconductor chip and a second subsection, which is free of the semiconductor chip,
wherein the adhesive has reflection particles to reflect electromagnetic radiation emitted by the semiconductor chip, and
the second subsection is covered at least partially by a corrosion protection layer after the adhesive bonding.

I discovered that the adhesive used to adhesively bond the semiconductor chip onto the reflection coating can have reflection particles. The particles advantageously reflect electromagnetic radiation emitted by the semiconductor chip during its operation. The reflection particles therefore advantageously lead to efficient reflection of the emitted electromagnetic radiation away from the carrier. This advantageously compensates for a possible deterioration of reflectivity of the reflection coating because of a degrading effect of a corrosive gas.

This thus means that although the reflection particles of the adhesive cannot prevent a possible deterioration of the reflectivity of the reflection coating because of the degrading effect of a corrosive gas, at least they can at least partially compensate for the possible deterioration. This contrasts with an optoelectronic component in which the semiconductor chip is adhesively bonded on a reflection coating by an adhesive which is free of reflection particles.

I furthermore found that the corrosion protection layer may acquire cracks by thermal and/or mechanical stress. Through such cracks, for example, a corrosive gas, for example, H$_2$S gas may penetrate to the adhesive, diffuse through the latter and then attack and ultimately corrode the reflection coating. The cracks predominantly occur at positions where an interface is formed between the corrosion protection layer and the adhesive.

The reflection particles cannot in fact prevent such corrosion. Nevertheless, by providing the reflection particles, a minimum level of reflectivity is provided so that a minimum reflection of the electromagnetic radiation can be achieved even when, in extreme cases, the entire reflection coating lying under the adhesive is corroded and therefore can no longer efficiently reflect the electromagnetic radiation by itself.

I furthermore found that, because of such corrosion, the color locus of electromagnetic radiation reflected by the corroded reflection coating may change compared to the electromagnetic radiation incident on the corroded reflection coating. This thus means, in particular, that the color locus of the electromagnetic radiation originally emitted by the semiconductor chip may shift because of reflection at a corroded position of the reflection coating. This color locus shift, however, is advantageously compensated for at least partially by the reflection particles, which always lead to a minimum level of reflectivity without a color locus shift. A possible color locus shift due to corrosion therefore becomes much less than when using an adhesive which is free of reflection particles.

The optoelectronic component may thus advantageously also be used in environments having corrosive gases.

A reflection coating may comprise a silver layer and/or a layer having a silver alloy.

The expression "cover" or "covers" includes in particular the expression "coat" or "coats".

A semiconductor chip may be configured as a light-emitting diode chip. The light-emitting diode chip may be configured as a volume emitter.

The adhesive may at least partially cover an edge region extending around the semiconductor chip, the edge region being part of the second subsection. This thus means that a subsidiary section is established in the second subsection: the edge region around the adhesively bonded semiconductor chip, the edge region being provided at least partially with adhesive. The adhesive therefore protrudes beyond the semiconductor chip. The corrosion protection layer is then arranged, inter alia, on the protruding adhesive, i.e. on the adhesive that at least partially covers the edge region.

That the adhesive can protrude may, for example, result from technical process reasons. For example, adhesive under the semiconductor chip is squeezed out when the semiconductor chip is pressed onto the chip mounting face.

The expression that the second subsection is covered at least partially by the corrosion protection layer includes, in particular, the second subsection being fully covered by the corrosion protection layer.

The protruding adhesive is, in particular, covered or provided by the corrosion protection layer.

The expression "at least partially" includes, in particular, the expression "fully".

The semiconductor chip may have a lower side and an upper side opposite the lower side, the semiconductor chip being adhesively bonded on the reflection coating of the chip mounting face with its lower side facing toward the chip mounting face so that an adhesive layer formed from adhesive and fully contacting the lower side is formed between the lower side and the reflection coating.

The semiconductor chip may have a lower side and an upper side opposite the lower side, the semiconductor chip being adhesively bonded on the reflection coating of the chip mounting face with its lower side facing toward the chip mounting face so that an adhesive layer formed from adhesive is formed between the lower side and the reflection coating. Preferably, the adhesive layer contacts, i.e. touches, the lower side of the semiconductor chip surface-wide. An adhesive layer contacting the lower side of the semiconductor chip surface-wide may thus be formed. Here, surface-wide means fully.

This, in particular, leads to the technical advantage that a reflection layer is formed immediately below the semiconductor chip, the adhesive layer comprising the reflection particles so that the reflection layer can efficiently reflect the electromagnetic radiation emitted by the semiconductor chip. This, for example, is of particular advantage when the semiconductor chip is configured as a light-emitting diode chip configured volume emitter.

Because of process tolerances, it may occur that the adhesive layer covers or contacts the lower side of the semiconductor chip incompletely, i.e. not surface-wide. The general expression that an adhesive layer is provided or formed between the lower side of the semiconductor chip and the reflective coating includes both the surface-wide, i.e. full, contacting and incomplete contacting.

Exposed surfaces of the semiconductor chip and/or of the carrier may be covered by the corrosion protection layer.

This, in particular, leads to the technical advantage that the exposed surfaces can also be protected efficiently against corrosive gases.

The semiconductor chip may be electrically contacted by one bonding wire or two bonding wires, the bonding wire or wires being covered by the corrosion protection layer.

This, in particular, leads to the technical advantage that the bonding wire or wires can also be protected efficiently against corrosive gases.

The carrier may be formed as an element selected from the following group of carriers: lead frame, circuit board, ceramic carrier. A lead frame may also be referred to as a connection frame.

An electronic component, in particular an ESD protection diode, connected into a circuit comprising the semiconductor chip, may furthermore be provided, which component according to another example is covered by the corrosion protection layer.

This, in particular, leads to the technical advantage that the electronic component can be protected efficiently against process gases.

For example, the electronic component is adhesively bonded on the carrier by a further adhesive. The further adhesive may be configured as an adhesive comprising reflection particles. Comments and described advantages and technical effects made in connection with the adhesive used to adhesively bond the semiconductor chip onto the chip mounting face apply similarly for the further adhesive, and vice versa. This thus means, in particular, that according to one example the further adhesive also comprises reflective particles.

The corrosion protection layer may comprise one or more inorganic layers, in particular an $Al_2O_3$ layer, $SiO_2$ layer, $Si_3N_4$ layer, $TiO_2$ layer, ZnO layer, $Ta_2O_5$ layer, $Ge_3N_4$ layer, $ZrO_2$ layer.

The corrosion protection layer is thus, for example, formed as a layer stack or as a layer arrangement.

The thickness of the corrosion protection layer may be 5 nm to 100 nm.

For example, an inorganic layer is applied by a sputtering method or a PECVD method, or an ALD method. "ALD" is "Atomic Layer Deposition". "PECVD" is "Plasma-Enhanced Chemical Vapor Deposition".

The reflection particles may comprise one or more elements selected from the following group of reflection particles: titanium dioxide ($TiO_2$) particles, aluminum oxide ($Al_2O_3$) particles, $SiO_2$ particles, ZnO particles, ZnS particles, BN particles.

These reflection particles lead, in particular, to efficient reflection.

The reflection particles may be configured as white reflection particles. The reflection particles therefore lead to a white color impression. Such reflection particles may also be referred to as white reflection particles. White reflection particles have, in particular, the technical advantage that they can reflect the emitted electromagnetic radiation particularly efficiently and do not change a color locus of the emitted electromagnetic radiation.

Particle size, in particular an average particle size, of the reflection particles may be 0.05 µm to 5 µm.

A mass fraction of the reflection particles may be 50% to 80%. In particular, the mass fraction is 70%, for example, 73%.

The adhesive may comprise one or more of the following materials or substances: silicone or siloxane-based materials, silicone-epoxide, epoxide, acrylate.

The semiconductor chip may be encapsulated or cast by an encapsulation material.

This, for example, leads to the technical advantage that the semiconductor chip can be protected efficiently against mechanical damage.

For example, the encapsulation material comprises one or more luminescent materials. A plurality of luminescent materials may also be referred to as a luminescent material combination.

In particular, the encapsulation material comprises a silicone or a silicone-based material. The luminescent material or the plurality of luminescent materials is or are, for example, embedded in the silicone.

The optoelectronic component may be produced by the method of producing an optoelectronic component.

Technical functionalities of the method of producing an optoelectronic component are found similarly from corresponding technical functionalities of the optoelectronic component. This thus means, in particular, that method features derive from corresponding features of the optoelectronic component and, and vice versa.

The semiconductor chip may have a lower side and an upper side opposite the lower side, the semiconductor chip being adhesively bonded on the chip mounting face with its lower side facing toward the chip mounting face so that an adhesive layer formed from adhesive and fully contacting the lower side is formed between the lower side and the first contact section.

The semiconductor chip may have a lower side and an upper side opposite the lower side, the semiconductor chip being adhesively bonded on the chip mounting face with its lower side facing toward the chip mounting face so that an adhesive layer formed from adhesive is formed between the lower side and the first contact section. Preferably, the adhesive layer contacts, i.e. touches, the lower side of the semiconductor chip surface-wide. An adhesive layer contacting the lower side of the semiconductor chip surface-wide may thus be formed. Here, surface-wide means fully.

Exposed surfaces of the semiconductor chip and/or of the carrier may be covered by the corrosion protection layer after the adhesive bonding.

After the adhesive bonding, the semiconductor chip may be electrically contacted by one bonding wire or two bonding wires, the bonding wire or wires being covered by the corrosion protection layer.

An electronic component, in particular an ESD protection diode, connected into a circuit comprising the semiconductor chip, may furthermore be provided, which component is covered by the corrosion protection layer after the adhesive bonding.

The carrier may be received in a housing.

The housing may have a cavity, the chip mounting face being arranged in a bottom region of the cavity. For example, a lateral face of the cavity is provided with the corrosion protection layer.

Provision of a cavity in the bottom region of which the semiconductor chip is arranged, leads in particular to the technical advantage that the semiconductor chip can be protected efficiently against damage by external mechanical effects.

The cavity may advantageously furthermore efficiently form an optical reflector for the semiconductor chip.

The lateral face may be provided with a reflection coating, which then may be covered with a corrosion protection layer.

For example, the cavity is filled at least partly, in particular fully, by the encapsulation material.

The semiconductor chip may be encapsulated by an encapsulation material.

The expression "or" includes in particular the expression "and/or".

The above-described properties, features and advantages, as well as the way in which they are achieved, will become more clearly and readily comprehensible in connection with the following description of examples, which will be explained in more detail in connection with the drawings.

FIG. 1 shows a schematic sectional side view of a first optoelectronic component 101. The optoelectronic component 101 is, for example, a light-emitting diode component.

The optoelectronic component 101 comprises a housing 103. The housing 103 has an upper side 105 and a lower side 107 opposite the upper side 105. The housing 103 of the optoelectronic component 101 comprises a housing frame 109 and, as a carrier, a lead frame 111 embedded in the housing frame 109. According to this example, the optoelectronic component 101 thus comprises a carrier configured as a lead frame. The housing frame 109 comprises, for example, an electrically insulating plastic material, for example, an epoxy resin. The housing frame 109 comprises, for example, a ceramic. The housing frame 109 is, for example, produced by a molding process or a casting process.

The lead frame 111 comprises an electrically conductive material, for example, a metal. In particular, the lead frame 111 comprises copper. Copper offers the advantage of being highly conductive electrically and thermally.

The electrically conductive material is at least partially, in particular fully, coated with a reflection coating 135, for example, with silver, which will be explained further below in connection with a first and second electrical contact section. This thus means that the electrically conductive material is at least partially, in particular fully, coated with silver or a silver-based alloy.

The lead frame 111 has an upper side 113 and a lower side 115 opposite the upper side 113. The upper side 113 of the lead frame 111 is, for example, at least partially, in particular fully, coated by the reflection coating 135. The reflection coating 135 comprises, for example, silver. In this respect the reflection coating 135 according to one example is a silver layer.

The lead frame 111 is subdivided into an electrically conductive first contact section 117 and an electrically conductive second contact section 119. The first contact section 117 and the second contact section 119 are physically separated from one another and electrically insulated from one another. The contact sections 117, 119 may also be referred to as lead frame sections.

At least one of the respective upper sides 113 of the two contact sections 117, 119 in particular both respective upper sides (as is also represented in the drawing) are provided at least partially in particular, fully, with the reflection coating 135. The reflection coating 135 is, for example, a silver layer.

The contact sections 117, 119 of the lead frame 111 are embedded in the housing frame 109 such that both the upper side 113 and the lower side 115 of the lead frame 111 are partially covered by the material of the housing frame 109. In the example represented, the lower side 115 of the lead frame 111 is partially covered by the material of the housing frame 109.

Both in the first contact section 117 and in the second contact section 119 of the lead frame 111, the respective upper side 113 is partially covered by the material of the housing frame 109 and partially uncovered.

The housing 103 of the optoelectronic component 101 has a cavity 121 on its upper side 105. The cavity 121 is formed as an indentation in the housing frame 109. On the upper side 105 of the housing 103, the cavity 121 has, for example, a discoid or rectangular cross section. In the sectional view of FIG. 1, the cavity 121 tapers in the shape of a truncated pyramid starting from the upper side 105 of the housing 103. According to one example not shown, the cavity 121 has a cylindrical shape or a different shape.

The cavity 121 of the housing 103 of the optoelectronic component 101 has a bottom region 123 and a circumferential wall 125. The wall 125 is formed by the material of the housing frame 109. The wall 125 forms a lateral face of the cavity 121. According to one example, the wall 125 of the cavity 121 of the housing 103 of the optoelectronic component 101 forms a reflector. Such a reflector is used, in particular, to collimate electromagnetic radiation emitted by the optoelectronic component 101. According to another example, the lateral face 125, or the wall of the cavity 121, is coated with the reflection coating 135.

In the bottom region 123 of the cavity 121 of the housing 103, parts of the respective upper side 113 of the two contact sections 117, 119 of the lead frame 111 are exposed. For better differentiation, the upper side of the first contact section 117 additionally has the reference 113a. For better differentiation, the upper side of the second contact section 119 additionally has the reference 113b. The upper side 113a of the first contact section 117 therefore forms a chip mounting face 153, which will be further explained below.

The optoelectronic component 101 furthermore comprises an optoelectronic semiconductor chip 127 or, in one example not shown, a plurality of optoelectronic semiconductor chips. Furthermore, in another example not shown, the optoelectronic component may additionally have one or more ESD protection diodes (not represented in FIG. 1). The optoelectronic semiconductor chip 127 (or the chips) is (are), for example, a light-emitting diode chip (LED chip). The optoelectronic semiconductor chip 127 has an upper side 129 and a lower side 131 opposite the upper side 129. The opposite outer sides or outer sidewalls 147 and the upper side 129 of the optoelectronic semiconductor chip 127 form, for example, a radiation emission face of the optoelectronic semiconductor chip 127. The optoelectronic semiconductor chip 127 is, for example, configured to radiate or emit electromagnetic radiation, for example, visible light on its outer faces. The semiconductor chip 127 is thus configured as a volume emitter.

On the upper side 129 of the optoelectronic semiconductor chip 127, two electrical contact faces (not shown) are formed, which will be referred to below as the first electrical chip contact face and the second electrical chip contact face.

By the two electrical chip contact faces, electrical contacting of the optoelectronic semiconductor chip 127 is made possible. For this electrical contacting, in the application example, two bonding wires 133 are provided. The two bonding wires 133 respectively contact the first electrically conductive chip contact face and the second electrically conductive chip contact face, respectively to the electrically conductive first contact section 117 and the electrically conductive second contact section 119. This means that a first electrical connection is formed by a first of the bonding wires 133 between the first contact section 117 and the first electrical contact face of the optoelectronic semiconductor chip 127. This thus means that a second electrical connection is formed by a second of the bonding wires 133 between the second electrical contact face of the optoelectronic semiconductor chip 127 and the second contact section 119.

Through the two electrical contact faces, an electrical current can be applied to the optoelectronic semiconductor chip 127 to make the optoelectronic semiconductor chip 127 emit electromagnetic radiation.

The optoelectronic semiconductor chip 127 is arranged in the cavity 121 of the housing 103 of the optoelectronic component 101. The optoelectronic semiconductor chip 127 is arranged with its lower side 131 on the chip mounting face 153 in the bottom region 123 of the cavity 121. In the example according to FIG. 1, the first contact section 117, i.e. in particular the upper side 113a of the first contact section 117, therefore forms a chip mounting face 153 for mounting of the semiconductor chip 127. The carrier, in this case the lead frame 111, therefore has a chip mounting face 153 coated by a reflection coating 135.

In this case, the lower side 131 of the optoelectronic semiconductor chip 127 faces toward the upper side 113a of the first contact section 117. The upper side 129 of the semiconductor chip 127 faces away from the upper side 113a of the first contact section 117 of the lead frame 111.

The respective upper side 113a,b of the two contact sections 117, 119 is at least partially, in particular fully, provided with the reflection coating 135.

The optoelectronic semiconductor chip 127 is adhesively bonded by an adhesive 137 on the upper side 113 of the chip mounting face 153, i.e. according to the example in FIG. 1 on the upper side 113a of the first contact section 117. In this respect, an adhesive layer 139 of adhesive 137 is formed between the lower side 131 of the semiconductor chip 127 and the upper side 113a of the first contact section 117.

The adhesive 137 comprises a plurality of reflection particles 141 for reflecting electromagnetic radiation emitted by the semiconductor chip 127.

Because of the reflection particles 141 contained by the adhesive 137, the adhesive layer 139 likewise contains reflection particles 141. A reflection layer, the adhesive layer containing reflection particles 141, is therefore advantageously formed below the lower side 131 of the semiconductor chip 127, i.e. between the lower side 131 of the semiconductor chip 127 and the upper side 113a of the first contact section 117. The lower side 131 of the semiconductor chip 127 is fully contacted by the adhesive layer 139.

The reflection particles 141 are, for example, configured as white reflection particles. For example, the reflection particles 141 comprise titanium dioxide particles and/or aluminum oxide particles.

The bonding wires 133 may be formed from silver or a silver-based alloy. In another example, the bonding wires 133 are coated by a corrosion protection layer, as described below.

The optoelectronic component 101 furthermore comprises an inorganic coating 143 as a corrosion protection layer. The inorganic coating 143 is, in particular, applied to the following elements: the upper side 105 of the housing 103, the lateral face 125 of the cavity 121, the reflection coating 135 except for the region on which the adhesive layer 139, or the semiconductor chip 127 is located, the upper side 129 of the semiconductor chip 127, the bonding wires 133 opposite sidewalls 147 of the semiconductor chip 127.

The cavity 121 is filled by a casting 145. The casting 145 may also be referred to as an encapsulation material. In this respect, the semiconductor chip 127 is encapsulated by the casting 145. The casting 145 therefore embeds in particular the semiconductor chip 127 and in particular the bonding wires 133. The casting 145 is preferably made of a material or a substance at least partially, in particular fully, transmissive or transparent for the electromagnetic radiation.

The casting 145 comprises, for example, an epoxy resin. The casting 145 comprises, for example, a silicone. The casting 145 comprises, for example, a silicone-containing hybrid material. The casting 145 comprises, for example, a silicone or epoxy resin or silicone-containing hybrid material filled with luminescent particles.

Because of mechanical and/or thermal stress, it may happen that the inorganic coating 143 acquires cracks. Through such cracks, a corrosive gas, for example, $H_2S$ gas may reach the respective upper side 113a,b of the two contact sections 117, 119 and corrode the reflection coating 135 there. For example, such a corrosive gas may diffuse through the casting 145. Such cracks predominantly occur in the region of the interface between the adhesive layer 139 and the corrosion protection layer 143, or have a particularly detrimental effect there.

The inorganic coating 143 comprises, for example: $Al_2O_3$ and/or $SiO_2$ and/or $Si_3N_4$. The thickness of the inorganic coating 143 is, for example, 5 nm to 100 nm. For example, the inorganic coating 143 is applied by a sputtering method or a PECVD method (plasma-enhanced chemical vapor deposition), or an ALD method (atomic layer deposition). "ALD" is "Atomic Layer Deposition". "PECVD" is "Plasma-Enhanced Chemical Vapor Deposition".

Provision of such an efficient corrosion protection advantageously prevents a reflection layer formed or applied on the upper side 113a,b of the first or second contact section 117, 119 of the lead frame 111 corroding. Such a corroded reflection layer generally leads to a deteriorated reflectivity and a color locus shift of the electromagnetic radiation reflected at such a corroded reflection layer. Provision of the corrosion protection can advantageously reduce such a color locus shift or reduction of the reflectivity.

Provision of the reflection particles 141 provides a minimum reflectivity for the emitted electromagnetic radiation. This is because, even with a completely corroded reflection coating 135 of the contact sections 117, 119, reflectivity is still caused because of the reflection particles 141.

This thus means that, even if the reflection coating 135 provided below the lower side 131 of the semiconductor chip 127 on the upper side 113a of the first contact section 117 were to be corroded, the electromagnetic radiation emitted by the semiconductor chip 127 would still be reflected by the reflection particles 141.

The electrically conductive second contact section 119 is, for example, covered or provided by the corrosion protection layer 143.

The reflection coating 135 of the first contact section 117 is therefore subdivided into a first subsection 149 which is covered by the semiconductor chip 127, or the adhesive layer 139, and a second subsection 151, which is free of the semiconductor chip 127.

Figure 2:
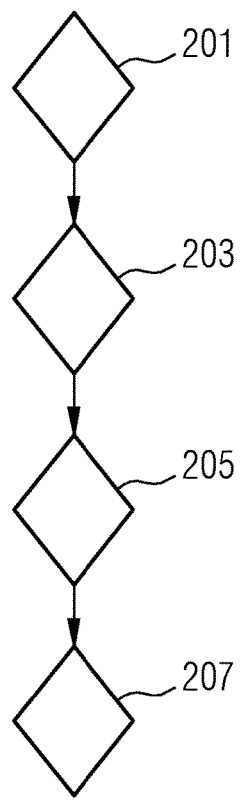
FIG. 2 shows a flowchart of a method of producing an optoelectronic component.

FIG. 2 shows a flowchart of a method of producing an optoelectronic component.

The method comprises the following steps:
providing 201 a carrier having a chip mounting face, the chip mounting face having a reflection coating,
adhesively bonding 203 an optoelectronic semiconductor chip onto the chip mounting face by an adhesive so that the reflection coating is subdivided 205 into a first subsection covered by the semiconductor chip and a second subsection, which is free of the semiconductor chip,
the adhesive having reflection particles that reflect electromagnetic radiation emitted by the semiconductor chip, and the second subsection being covered 207 at least partially by a corrosion protection layer after the adhesive bonding 203.

According to an example not shown, an ESD protection diode is adhesively bonded onto the carrier and electrically contacted.

For example, the inorganic coating is applied after electrical contacting of the semiconductor chip by one or two bonding wires. The bonding wire or wires may likewise be covered by the corrosion protection layer.

In the examples described above, the upper side 113a of the first contact section 117 forms a chip mounting face. According to one example which is not shown, the lead frame 111 has a third section in addition to the first and second contact sections 117, 119. In this example, an upper side of the third section forms the chip mounting face. This means that the upper side of the third section is provided at least partially by the reflection coating 135. Electrical contacting of the semiconductor chip 127 is formed in this example by the bonding wires 133, which establish an electrical connection from the contact sections 117, 119 to the semiconductor chip 127.

Figure 3:
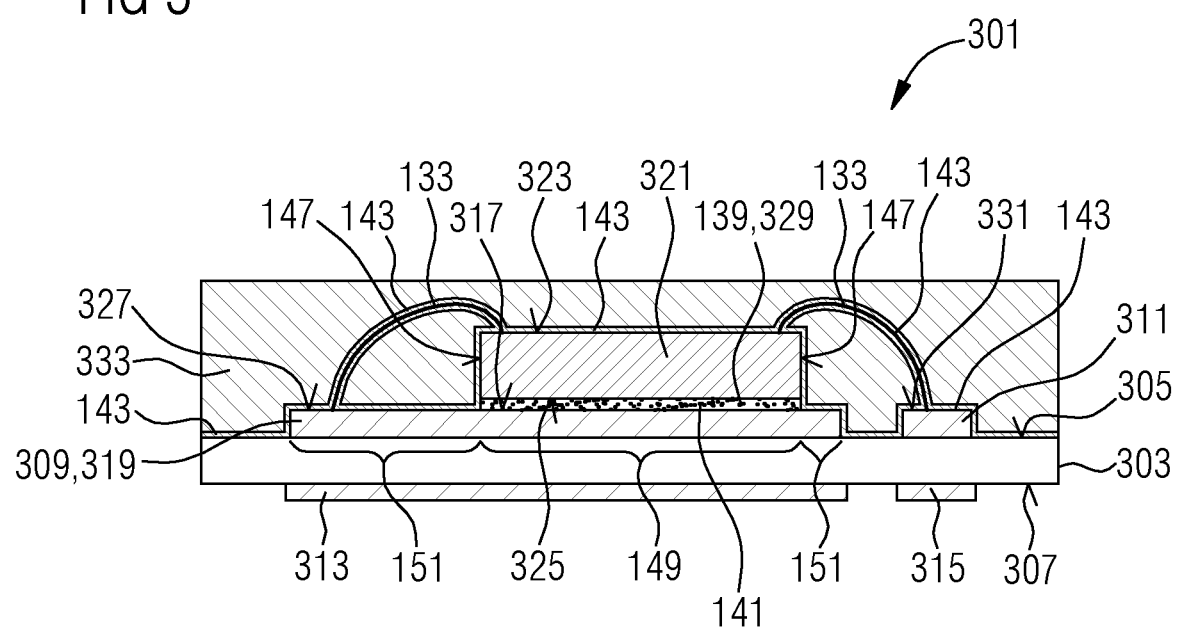
FIG. 3 shows a second optoelectronic component.

FIG. 3 shows a second optoelectronic component 301.

For features which are the same, the same references as in FIG. 1 are sometimes used. The corresponding remarks apply similarly.

The component 301 comprises a carrier 303. The carrier 303 is configured as a ceramic substrate. The carrier 303 is thus formed from a ceramic.

The carrier has an upper side 305 and a lower side 307 opposite the upper side 305.

A first metallization 309 and a second metallization 311 are electrically insulated from one another and applied on the upper side 305.

A third metallization 313 and a fourth metallization 315 are electrically insulated from one another and applied on the lower side 307.

The respectively opposite metallizations 309 and 313, and 311 and 315, on the upper and lower sides are electrically conductively connected to one another. For example, electrical through-contacts, so-called vias, are provided to connect the corresponding metallizations of the upper and lower side electrically conductively to one another.

The four metallizations 309, 311, 313, 315 are, for example, formed from silver or an alloy containing silver.

The upper side 305 of the carrier 303 forms a chip mounting face 317 for an optoelectronic semiconductor chip 321. The first metallization 309 is provided with a reflection coating 319. This means that the chip mounting face 317 is coated with the reflection coating 319. The second metallization 311 may likewise be provided with a reflection coating.

The semiconductor chip 321 has an upper side 323 and a lower side 325 opposite the upper side 323. The semiconductor chip 321 is adhesively bonded by an adhesive 329 with its lower side 325 on an upper side 327, facing away from the upper side 305 of the carrier 303, of the reflection coating 319. The adhesive 329 has reflection particles 141 to reflect electromagnetic radiation emitted by the semiconductor chip 321. An adhesive layer 139 of adhesive 329 is therefore formed between the lower side 325 of the semiconductor chip 321 and the upper side 327 of the reflection coating 319. The lower side 325 of the semiconductor chip 321 is contacted fully, i.e. surface-wide, by the adhesive layer 139.

In a similar way to the example shown in FIG. 1, the semiconductor chips 321 is electrically contacted by two bonding wires 133 on its upper side 323. One of the bonding wires 133 forms an electrical connection between a first electrical chip contact face (not shown here) on the upper side 323 of the semiconductor chip 321 and the first metallization 309. The other of the bonding wires 133 forms an electrical connection between a second electrical chip contact face (not shown here) on the upper side 323 of the semiconductor chip 321 and the second metallization 311.

The reflection coating 319 is therefore subdivided into a first subsection 149 covered by the semiconductor chip 321, or adhesive layer 139, and a second subsection 151, which is free of the semiconductor chip 321. The metallization 311 may, for example, also be configured as a reflection coating.

In a similar way to the example shown in FIG. 1, an inorganic coating 143 is provided as a corrosion protection layer, the coating covering at least the following elements: exposed surfaces of the carrier 303, or of the two metallizations 309 and 311, i.e. in particular exposed sections of the upper side 305 of the carrier 303, exposed sections of the upper side 327 of the first metallization 309, and an upper side 331 of the second metallization 311, the upper side 323 of the semiconductor chip 321, the bonding wires 133, the opposite sidewalls 147 of the semiconductor chip 321, and an open adhesive layer 139 which is not covered by the semiconductor chip 321, if the adhesive 329 is intended to protrude, which is not shown for the sake of clarity. For example, when the semiconductor chip 321 is pressed onto the reflection coating 319 during the adhesive bonding, it can thus happen that the adhesive 329 under the semiconductor chip 321 is squeezed out so that there is also adhesive 329 on the reflection coating 319 around the semiconductor chip 321, i.e. in an edge region around the semiconductor chip 321, this edge region being contained by the second subsection 151.

Furthermore, a casting 333 is provided, which may also be referred to as an encapsulation material. The semiconductor chip 321 and the bonding wires 133 are encapsulated by the casting 333. The casting 333 therefore embeds, in particular the semiconductor chip 321 and in particular the bonding wires 133. The casting 333 is preferably made of a material or a substance at least partially, in particular fully, transmissive or transparent for the electromagnetic radiation.

The casting 333 comprises, for example, an epoxy resin. The casting 333 comprises, for example, a silicone. The casting 333 comprises, for example, a silicone-containing hybrid material. The casting 333 comprises, for example, a silicone or epoxy resin or silicone-containing hybrid material filled with luminescent particles.

In the example shown in FIG. 3, the casting 333 has a rectangular shape. In one example not shown, the casting 333 has a dome-like shape.

In one example not shown, the carrier consists of a circuit board.

In another example not shown, the carrier consists of a metal lead frame. In this case, the metallization is the lead frame itself.

Although my components and methods have been illustrated and described in detail by preferred examples, this disclosure is not restricted to the examples disclosed, and other variants may be derived therefrom by those skilled in the art without departing from the protective scope of the appended claims.

This application claims priority of DE 10 2016 106 494.7, the subject matter of which is incorporated herein by reference.

The invention claimed is:

1. An optoelectronic component comprising:
a carrier having a chip mounting face, wherein the chip mounting face has a reflection coating, and
an optoelectronic semiconductor chip adhesively bonded on the reflection coating by an adhesive so that the reflection coating is subdivided into a first subsection covered by the semiconductor chip and a second subsection, which is free of the semiconductor chip,
wherein the adhesive has reflection particles that reflect electromagnetic radiation emitted by the semiconductor chip, and
the second subsection is at least partially covered by a corrosion protection layer.

2. The optoelectronic component as claimed in claim 1, wherein the semiconductor chip has a lower side and an upper side opposite the lower side, the semiconductor chip being adhesively bonded on the reflection coating of the chip mounting face with the lower side facing toward the chip mounting face so that an adhesive layer formed from the adhesive and fully contacting the lower side is formed between the lower side and the reflection coating.

3. The optoelectronic component as claimed in claim 1, wherein the semiconductor chip has a lower side and an upper side opposite the lower side, the semiconductor chip being adhesively bonded on the reflection coating of the chip mounting face with the lower side facing toward the chip mounting face so that an adhesive layer formed from the adhesive and fully contacting the lower side is formed between the lower side and the reflection coating, and the upper side of the semiconductor chip is covered by the corrosion protection layer.

4. The optoelectronic component as claimed in claim 1, wherein exposed surfaces of the carrier are covered by the corrosion protection layer.

5. The optoelectronic component as claimed in claim 1, wherein the semiconductor chip is electrically contacted by one bonding wire or two bonding wires, the bonding wire or wires being covered by the corrosion protection layer.

6. The optoelectronic component as claimed in claim 1, wherein the carrier is formed as an element selected one from the group consisting of lead frame, circuit board and ceramic carrier.

7. The optoelectronic component as claimed in claim 1, further comprising an electronic component or an ESD protection diode connected into a circuit comprising the semiconductor chip and covered by the corrosion protection layer.

8. The optoelectronic component as claimed in claim 1, wherein the corrosion protection layer comprises one or more inorganic layers selected one from a group consisting of an $Al_2O_3$ layer, $SiO_2$ layer, $Si_3N_4$ layer, $TiO_2$ layer, ZnO layer, $Ta_2O_5$ layer, $Ge_3N_4$ layer and $ZrO_2$ layer.

9. The optoelectronic component as claimed in claim 1, wherein the reflection particles comprise one or more elements selected from the group consisting of titanium dioxide ($TiO_2$) particles, aluminum oxide ($Al_2O_3$) particles, $SiO_2$ particles, ZnO particles, ZnS particles and BN particles.

10. The optoelectronic component as claimed in claim 1, wherein an average particle size of the reflection particles is 0.05 μm to 5 μm.

11. The optoelectronic component as claimed in claim 1, wherein a mass fraction of the reflection particles is 50% to 80%.

12. An optoelectronic component comprising:
a carrier having a chip mounting face, wherein the chip mounting face has a reflection coating, and an optoelectronic semiconductor chip adhesively bonded on the reflection coating by an adhesive so that the reflection coating is subdivided into a first subsection covered by the semiconductor chip and a second subsection, which is free of the semiconductor chip,
wherein the adhesive has reflection particles that reflect electromagnetic radiation emitted by the semiconductor chip,
the second subsection is at least partially covered by a corrosion protection layer,
the adhesive at least partially covers an edge region extending around the semiconductor chip, the edge region being part of the second subsection,
the adhesive protrudes beyond the semiconductor chip,
the corrosion protection layer is arranged on the adhesive protruding beyond the semiconductor chip,
wherein the semiconductor chip has a lower side and an upper side opposite the lower side, the semiconductor chip being adhesively bonded on the reflection coating of the chip mounting face with the lower side facing toward the chip mounting face so that an adhesive layer formed from the adhesive and fully contacting the lower side is formed between the lower side and the reflection coating, and the upper side of the semiconductor chip is covered by the corrosion protection layer.

13. A method of producing an optoelectronic component, comprising:
providing a carrier having a chip mounting face, the chip mounting face having a reflection coating, and
adhesively bonding an optoelectronic semiconductor chip onto the chip mounting face by an adhesive so that the reflection coating is subdivided into a first subsection covered by the semiconductor chip and a second subsection, which is free of the semiconductor chip,
the adhesive having reflection particles that reflect electromagnetic radiation emitted by the semiconductor chip, and
the second subsection is covered at least partially by a corrosion protection layer after the adhesive bonding.

14. The method as claimed in claim 13, wherein the semiconductor chip has a lower side and an upper side opposite the lower side, the semiconductor chip being adhesively bonded on the chip mounting face with its lower side facing toward the chip mounting face so that an adhesive layer formed from adhesive and fully contacting the lower side is formed between the lower side and the first contact section.

15. The method as claimed in claim 13, wherein the semiconductor chip has a lower side and an upper side opposite the lower side, the semiconductor chip being adhesively bonded on the chip mounting face with its lower side facing toward the chip mounting face so that an adhesive layer formed from adhesive and fully contacting the lower side is formed between the lower side and the first contact section, and the upper side of the semiconductor chip is covered by the corrosion protection layer after the adhesive bonding.

16. The method as claimed in claim 13, wherein, after the adhesive bonding, the semiconductor chip is electrically contacted by one bonding wire or two bonding wires, the bonding wire or wires being covered by the corrosion protection layer.

17. The method as claimed in claim 13, wherein the carrier is formed as an element selected from the group consisting of lead frame, circuit board and ceramic carrier.

18. The method as claimed in claim 13, wherein an electronic component or an ESD protection diode connected into a circuit comprising the semiconductor chip, is further provided, which component is covered by the corrosion protection layer after the adhesive bonding.

19. The method as claimed in claim 13, wherein an average particle size of the reflection particles is 0.05 μm to 5 μm.

20. The method as claimed in claim 13, wherein a mass fraction of the reflection particles is 50% to 80%.

* * * * *